United States Patent
Zhao et al.

(10) Patent No.: US 11,823,640 B2
(45) Date of Patent: Nov. 21, 2023

(54) DISPLAY SUBSTRATE AND DISPLAY DEVICE

(71) Applicants: Beijing BOE Display Technology Co., Ltd., Beijing (CN); BOE Technology Group Co., Ltd., Beijing (CN)

(72) Inventors: Chongyang Zhao, Beijing (CN); Yingmeng Miao, Beijing (CN); Qiujie Su, Beijing (CN); Zhihua Sun, Beijing (CN); Wenjie Hou, Beijing (CN); Feng Qu, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 224 days.

(21) Appl. No.: 17/429,937

(22) PCT Filed: Oct. 30, 2020

(86) PCT No.: PCT/CN2020/125434
§ 371 (c)(1),
(2) Date: Aug. 10, 2021

(87) PCT Pub. No.: WO2022/088079
PCT Pub. Date: May 5, 2022

(65) Prior Publication Data
US 2022/0351698 A1    Nov. 3, 2022

(51) Int. Cl.
*G09G 3/36* (2006.01)
*H01L 27/12* (2006.01)

(52) U.S. Cl.
CPC ......... *G09G 3/3677* (2013.01); *H01L 27/124* (2013.01); *H01L 27/1225* (2013.01)

(58) Field of Classification Search
CPC ......... G09G 3/3677; G09G 2300/0408; G09G 3/3611; G09G 3/36; G09G 3/32;
(Continued)

(56) References Cited

U.S. PATENT DOCUMENTS

2011/0043508 A1*  2/2011  Han ................. G09G 3/3258
                                                                 345/211
2018/0211876 A1*  7/2018  Li ........................ H01L 27/12
(Continued)

FOREIGN PATENT DOCUMENTS

CN        111090202 A     5/2020
CN        111429859 A     7/2020
(Continued)

*Primary Examiner* — Pegeman Karimi
(74) *Attorney, Agent, or Firm* — IPro, PLLC

(57) ABSTRACT

The present disclosure provides a display substrate and a display device. The display substrate includes: a gate driving circuitry arranged at a peripheral region of the display substrate; n clock signal leads coupled to the gate driving circuitry, each clock signal lead extending in a first direction; and n clock signal lines arranged sequentially in the first direction, each clock signal line extending in a second direction intersecting the first direction, where n is a positive integer greater than 1. The clock signal leads have a same length in the first direction, each clock signal lead extends from a first clock signal line to an nth clock signal line, and each clock signal lead is coupled to a corresponding clock signal line at a position where the clock signal lead intersects the clock signal line.

15 Claims, 2 Drawing Sheets

(58) Field of Classification Search
CPC .. G09G 3/20; G09G 3/00; G09G 5/00; G09G 5/008; G09G 5/005; H01L 27/1225; H01L 27/124; G02F 1/1362
See application file for complete search history.

(56) References Cited

U.S. PATENT DOCUMENTS

2020/0342806 A1* 10/2020 Kim .................... G06F 3/04164
2021/0335174 A1* 10/2021 Lin .......................... G09G 3/20

FOREIGN PATENT DOCUMENTS

| CN | 111445831 A | 7/2020 |
| CN | 211238253 U | 8/2020 |
| CN | 111624827 A | 9/2020 |

* cited by examiner

DISPLAY SUBSTRATE AND DISPLAY DEVICE

CROSS-REFERENCE TO RELATED APPLICATION

The present application is the U.S. national phase of PCT Application No. PCT/CN2020/125434 filed on Oct. 30, 2020, the disclosure of which is incorporated herein by reference in its entirety.

TECHNICAL FIELD

The present disclosure relates to the field of display technology, in particular to a display substrate and a display device.

BACKGROUND

Along with the development of the display technology, a Liquid Crystal Display (LCD) has already dominated the display industry. In order to reduce a size of a bezel, more and more products start to adopt a Gate On Array (GOA) driving design to replace a gate Chip On Flex/Film (COF) driving design. In GOA driving architecture, usually different clock signals are used to adjust a sequence of turning on gate electrodes of a panel, and each CLK line (clock signal line) needs to be coupled to a Thin Film Transistor (TFT) region of the GOA driving architecture via a CLK lead (clock signal lead) at an output end, so as to provide the clock signal. Due to different positions, different CLK leads have different lengths, coupling capacitances (overlapping capacitances) generated between the CLK leads and a Black Matrix (BM) layer on a Color Film (CF) substrate may be different. At this time, a delay difference may occur for the clock signals, and thereby horizontal Mura may occur.

SUMMARY

An object of the present disclosure is to provide a display substrate and a display device, so as to reduce a size of a bezel while preventing the occurrence of horizontal Mura in a GOA product.

The technical solutions in the embodiments of the present disclosure will be described as follows.

In one aspect, the present disclosure provides in some embodiments a display substrate, including: a gate driving circuitry arranged at a peripheral region of the display substrate; n clock signal leads coupled to the gate driving circuitry, each clock signal lead extending in a first direction; and n clock signal lines arranged sequentially in the first direction, each clock signal line extending in a second direction intersecting the first direction, where n is a positive integer greater than 1. The clock signal leads have a same length in the first direction, each clock signal lead extends from a first clock signal line to an $n^{th}$ clock signal line, and each clock signal lead is coupled to a corresponding clock signal line at a position where the clock signal lead intersects the clock signal line.

In a possible embodiment of the present disclosure, the n clock signal lines are arranged sequentially from a side away from the gate driving circuitry to a side close to the gate driving circuitry in the first direction, the n clock signal leads are arranged sequentially from one end of each clock signal line to the other end of the clock signal in the second direction, and an $m^{th}$ clock signal lead is coupled to an $m^{th}$ clock signal line, where m is a positive integer greater than or equal to 1 and smaller than or equal to n.

In a possible embodiment of the present disclosure, the clock signal lines are arranged at a layer different from the clock signal leads, and each clock signal line is coupled to the corresponding clock signal lead through a via-hole.

In a possible embodiment of the present disclosure, the display substrate further includes a base substrate, a gate metal layer arranged on the base substrate, a source/drain metal layer arranged on the base substrate, and an indium tin oxide (ITO) layer arranged on the base substrate. The gate metal layer includes a pattern of the clock signal lines, the source/drain metal layer includes a pattern of the clock signal leads, and the clock signal lines and the clock signal leads are coupled to the ITO layer through via-holes.

In a possible embodiment of the present disclosure, the display substrate further includes a base substrate, a gate metal layer arranged on the base substrate, a source/drain metal layer arranged on the base substrate, and an ITO layer arranged on the base substrate. The gate metal layer includes a pattern of the clock signal lines, the ITO layer includes a pattern of the clock signal leads, and each clock signal line is coupled to the corresponding clock signal lead through a via-hole in an insulation layer between the ITO layer and the gate metal layer.

In a possible embodiment of the present disclosure, the gate driving circuitry includes a clock signal generation member. An end of each clock signal lead extending to the gate driving circuitry is coupled to the source/drain metal layer through a via-hole, and then coupled to the clock signal generation member through the source/drain metal layer.

In a possible embodiment of the present disclosure, the ITO layer is a second ITO layer including a pixel electrode pattern.

In a possible embodiment of the present disclosure, each clock signal lead includes a lapping portion extending in the second direction at a position where each clock signal lead intersects the corresponding clock signal line, and the lapping portion is coupled to the corresponding clock signal line through the via-hole.

In a possible embodiment of the present disclosure, orthogonal projections of the lapping portions of the clock signal leads onto the base substrate have a same area, and the clock signal leads have a same line width.

In another aspect, the present disclosure provides in some embodiments a display device including the above-mentioned display substrate.

The present disclosure has the following beneficial effects.

According to the display substrate and the display device in the embodiments of the present disclosure, each clock signal lead may be designed as to extend from the first clock signal line to the $n^{th}$ clock signal line (i.e., through all the clock signal lines), so the clock signal lines may be provided with a same length in the second direction and a sum of the length of each clock signal line and the length of the corresponding clock signal lead may be the same. In this way, it is able to compensate for coupling capacitances generated between the clock signal leads and a BM layer at different positions, and enable the coupling capacitances to be substantially the same, thereby to prevent the occurrence of horizontal Mura. In addition, it is unnecessary to provide an additional capacitance compensation region at a bezel portion, so as to facilitate the design of an ultra-narrow bezel.

DETAILED DESCRIPTION

Figure 1:
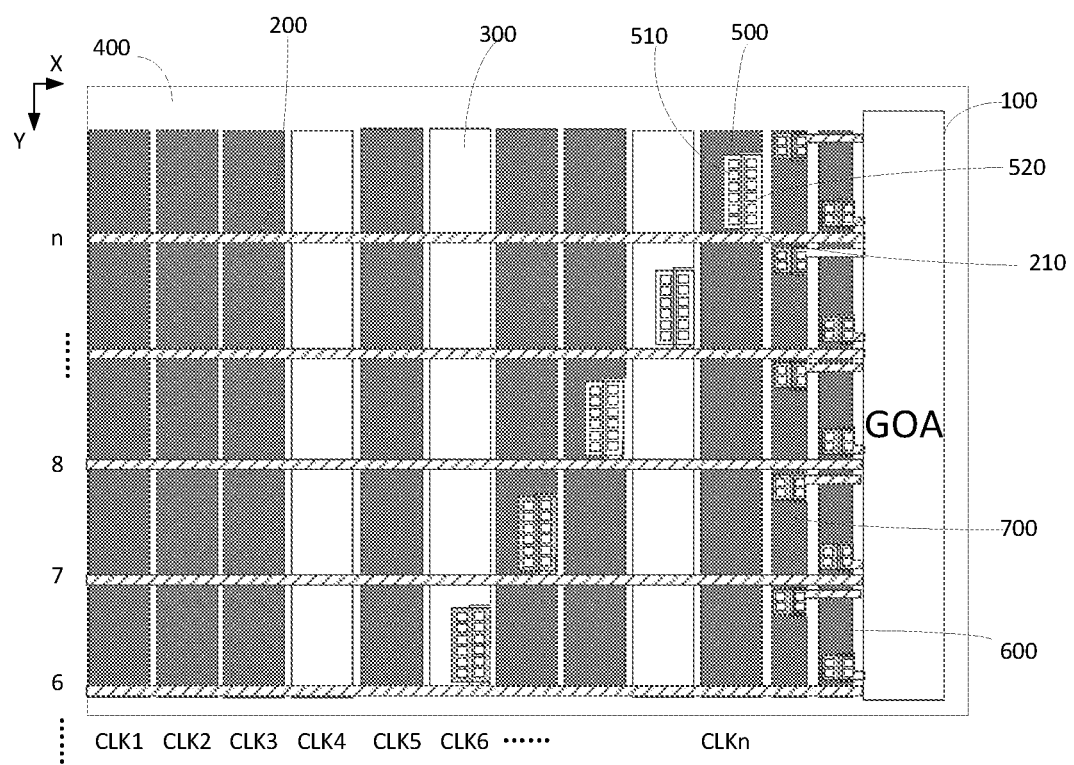
FIG. 1 is a partially schematic view showing a display substrate according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "a", "an" or "the" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Before the detailed description on the embodiments of the present disclosure, it is necessary to describe the related art as follows.

In conventional GOA driving architecture, usually different clock signals are used to adjust a sequence of turning on gate electrodes of a panel, and each CLK line (clock signal line) needs to be coupled to a TFT region of the GOA driving architecture via a CLK lead (clock signal lead) at an output end, so as to provide the clock signal. Due to different positions, different CLK leads have different lengths, coupling capacitances generated between the CLK leads and a BM layer on a CF substrate may be different. At this time, a delay difference may occur for the clock signals, and thereby horizontal Mura may occur.

In the related art, a method for solving the above problem includes providing a capacitance compensation region at a bezel portion, and arranging each CLK lead in a zigzag manner at the capacitance compensation region, so as to provide a same coupling capacitance between each CLK lead and the BM layer. However, in this method, it is necessary to provide the individual capacitance compensation region where the CLK leads are arranged, so it is adverse to the design of an ultra-narrow bezel. In addition, for a product with a high resolution or high refresh rate, usually ten or more CLK lines are provided due to a difficulty in charging pixels, so the capacitance compensation region needs to occupy more space in the bezel.

An object of the present disclosure is to provide a display substrate and a display device, so as to reduce a size of the bezel while preventing the occurrence of the horizontal Mura in the GOA product.

Figure 2:
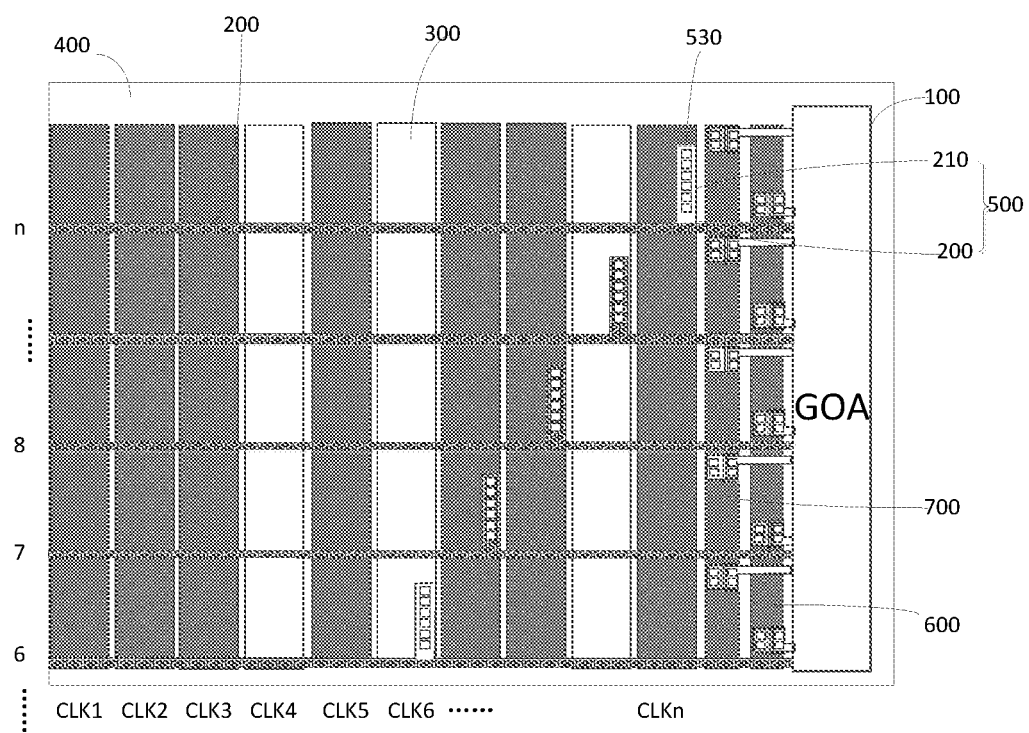
FIG. 2 is another schematic view showing the display substrate according to one embodiment of the present disclosure.

As shown in FIGS. 1 and 2, the present disclosure provides in some embodiments a display substrate, which includes: a gate driving circuitry (GOA circuitry) 100 at a peripheral region of the display substrate; n clock signal leads 200 coupled to the gate driving circuitry 100, each clock signal lead 200 extending in a first direction (direction X in FIG. 1); and n clock signal lines 300 arranged sequentially in the first direction, each clock signal line 300 extending in a second direction (direction Y in FIG. 1) intersecting the first direction, where n is a positive integer greater than 1. The clock signal leads 200 have a same length in the first direction, each clock signal lead 200 extends from a first clock signal line 300 to an $n^{th}$ clock signal line 300, and each clock signal lead 200 is coupled to a corresponding clock signal line 300 at a position where the clock signal lead 200 intersects the clock signal line 300.

According to the embodiments of the present disclosure, each clock signal lead 200 may be designed as to extend from the first clock signal line 300 to the $n^{th}$ clock signal line 300 (i.e., through all the clock signal lines 300), so the clock signal lines 200 may be provided with a same length in the second direction and a sum of the length of each clock signal line 300 and the length of the corresponding clock signal lead 200 may be the same. In this way, it is able to compensate for coupling capacitances generated between the clock signal leads 200 and a BM layer at different positions, and enable the coupling capacitances to be substantially the same, thereby to prevent the occurrence of horizontal Mura. In addition, it is unnecessary to provide an additional capacitance compensation region at a bezel portion, so as to facilitate the design of an ultra-narrow bezel.

In some embodiments of the present disclosure, the n clock signal lines 300 may include the first clock signal line, a second clock signal line, . . . , and the $n^{th}$ clock signal line arranged sequentially from a side away from the gate driving circuitry 100 to a side close to the gate driving circuitry 100 in the first direction. Identically, the n clock signal leads 200 may include a first clock signal lead, a second clock signal lead, . . . , and an $n^{th}$ clock signal lead arranged sequentially from one end of each clock signal line to the other end of the clock signal line in the second direction (FIGS. 1 and 2 merely show a part of the clock signal leads). An $m^{th}$ clock signal lead 200 may be coupled to an $m^{th}$ clock signal line 300, where m is a positive integer greater than or equal to 1 and smaller than or equal to n.

In other words, a coupling relationship between the clock signal lines 30 and the clock signal leads 200 may be described as follows: the first clock signal line may be coupled to the first clock signal lead, the second clock signal line may be coupled to the second clock signal lead, . . . , and the $n^{th}$ clock signal line may be coupled to the $n^{th}$ clock signal lead.

Of course, it should be appreciated that, the above is for illustrative purposes only, and in practical applications, the coupling relationship between the clock signal lines 300 and the clock signal leads 200 shall not be limited thereto.

In addition, in some embodiments of the present disclosure, the clock signal lines 300 may be arranged at a layer different from the clock signal leads 200, and each clock signal line 300 may be coupled to the corresponding clock signal lead 200 through a via-hole.

In the above scheme, when the clock signal lines 300 are arranged at a layer different from the clock signal leads 200, an orthogonal projection of each clock signal line 300 onto a base substrate may intersect an orthogonal projection of the corresponding clock signal lead 200 onto the base substrate, and the clock signal line 300 may be coupled to the corresponding clock signal lead 200 through a via-hole in a film layer arranged therebetween.

For example, in some embodiments of the present disclosure, as shown in FIG. 1, the display substrate further includes a base substrate 400, a gate metal layer (Gate layer) arranged on the base substrate 400, a source/drain metal layer (SD layer) arranged on the base substrate 400, and an ITO layer 500 arranged on the base substrate 400. The gate metal layer includes a pattern of the clock signal lines 300, the source/drain metal layer includes a pattern of the clock signal leads 200, and the clock signal lines 300 and the clock signal leads 200 are coupled to the ITO layer 500 through via-holes.

In the embodiments of the present disclosure, the clock signal lines 300 may be formed through patterning the gate metal layer, and the clock signal leads 200 may be formed through patterning the source/drain metal layer. As shown in FIG. 1, the ITO layer 500 may be arranged between the gate metal layer where the clock signal lines 300 are located and the source/drain metal layer where the clock signal leads 200 are located, and the ITO layer 500 may be patterned to form a connection pattern for connecting each clock signal line 30 and the corresponding clock signal lead 200. A portion of the connection pattern may be coupled to each clock signal line 300 through a first via-hole 510 in a first insulation layer between the ITO layer and the clock signal line 300, and another portion of the connection pattern may be coupled to each clock signal lead 200 through a second via-hole 520 in a second insulation layer between the ITO layer and the clock signal lead 200.

In some embodiments of the present disclosure, the quantity of first via-holes may be equal to the quantity of second via-holes. For example, as shown in FIG. 1, the quantity of first via-holes 510 and the quantity of second via-holes 520 are each six. Of course, it should be appreciated that, in practical applications, the quantity of the via-holes will not be particularly defined.

In addition, in the embodiments of the present disclosure, for example, each clock signal lead 200 may include a lapping portion 210 extending in the second direction at a position where each clock signal lead 200 intersects corresponding clock signal line 300, and the lapping portion 210 may be coupled to the corresponding clock signal line 300 through the via-hole, i.e., the lapping portion 210 may be coupled to the connection pattern through the second via-hole 520.

In addition, it should be appreciated that, in the embodiments of the present disclosure, for a display product with an Advanced Switching (ADS) mode, the display substrate may include a first ITO layer (1ITO) and a second ITO layer (2ITO). The first ITO layer may be used to form a common electrode pattern, and the second ITO layer may be used to form a pixel electrode pattern.

In some embodiments of the present disclosure, the ITO layer 500 for coupling each clock signal line 300 to the corresponding clock signal lead 200 may be the second ITO layer (2ITO) including the pixel electrode pattern.

Of course, it should be appreciated that, the above is for illustrative purposes only. In practical applications, the ITO layer 500 for coupling each clock signal line 300 to the clock signal lead 200 may also be the first ITO layer (1ITO).

In addition, it should be appreciated that, in the embodiments of the present disclosure, due to a difference among positions where each clock signal lead 200 is coupled to, i.e., intersects, the corresponding clock signal line 300, resistances of the clock signal leads 200 may be different. However, the difference among the resistances is sufficiently small to not cause the horizontal Mura. When the clock signal lead 200 is formed through the source/drain metal layer, the resistance of each clock signal lead 200 may be small, and the difference among the resistances of the clock signal leads 200 may be much smaller.

In some other embodiments of the present disclosure, as shown in FIG. 2, the display substrate further includes a base substrate 400, a gate metal layer (Gate layer) arranged on the base substrate 400, a source/drain metal layer (SD layer) arranged on the base substrate 400, and an ITO layer 500 arranged on the base substrate 400. The gate metal layer includes a pattern of the clock signal lines 300, the ITO layer 500 includes a pattern of the clock signal leads 200, and each clock signal line 300 is coupled to the corresponding clock signal lead 200 through a third via-hole 530 in an insulation layer between the ITO layer 500 and the gate metal layer.

In the embodiments of the present disclosure, the clock signal line 300 may be formed through patterning the gate metal layer, and the clock signal lead 200 may be formed through patterning the ITO layer 500. At this time, each clock signal lead 200 may include a lapping portion 210 extending in the second direction at a position where each clock signal lead 200 intersects the corresponding clock signal line 300, and the lapping portion 210 may be coupled to the corresponding clock signal line 300 directly through the third via-hole 530 in a first insulation layer between the gate metal layer and the ITO layer 500.

In some embodiments of the present disclosure, as shown in FIG. 2, the quantity of via-holes may be six. Of course, it should be appreciated that, in practical applications, the quantity of via-holes will not be particularly defined.

In addition, it should be appreciated that, in the embodiments of the present disclosure, for a display product with an ADS mode, the display substrate may include a first ITO layer (1ITO) and a second ITO layer (2ITO). The first ITO layer may be used to form a common electrode pattern, and the second ITO layer may be used to form a pixel electrode pattern. In some embodiments of the present disclosure, the ITO layer 500 for coupling each clock signal line 300 to the corresponding clock signal lead 200 may be the second ITO layer (2ITO) including the pixel electrode pattern.

Of course, it should be appreciated that, the above is for illustrative purposes only. In practical applications, the ITO layer 500 for coupling each clock signal line 300 to the clock signal lead 200 may also be the first ITO layer (1ITO).

In addition, in the embodiments of the present disclosure, the gate driving circuitry 100 may include a clock signal generation member. An end of each clock signal lead 200 extending to the gate driving circuitry 100 may not be directly coupled to the clock signal generation member of the gate driving circuitry 100. Instead, it may be coupled to the source/drain metal layer in the gate driving circuitry 100 through a via-hole, and then coupled to the clock signal generation member through the source/drain metal layer.

It should be appreciated that, in the embodiments of the present disclosure, as compared with a situation where the clock signal lead 200 is formed through patterning the source/drain metal layer, when the clock signal lead 200 is formed through patterning the ITO layer 500, a coupling capacitance generated between the ITO layer 500 and the clock signal line 300 may be smaller.

In addition, in some embodiments of the present disclosure, as shown in FIGS. 1 and 2, orthogonal projections of the lapping portions 210 of the clock signal leads onto the base substrate 400 may have a same area, and the clock signal leads may have a same line width. In this way, an area of a portion of each clock signal lead overlapping the BM layer may be the same, so it is able to further ensure the same coupling capacitance between each clock signal lead and the BM layer.

In addition, as shown in FIGS. 1 and 2, in some embodiments of the present disclosure, some other signal lines, e.g., an STV line 600 and a VDD line 700, may be further arranged between the clock signal line and the gate driving circuitry.

The present disclosure further provides in some embodiments a display device which includes the above-mentioned display substrate. The display device may be any product or member having a display function, e.g., a liquid crystal television, liquid crystal display, a digital phone frame, a mobile phone or a tablet computer. The display device may further include a flexible circuit board, a printed circuited board and a back plate.

Some descriptions will be given as follows.
(1) The drawings merely relate to structures involved in the embodiments of the present disclosure, and the other structures may refer to those known in the art.
(2) For clarification, in the drawings for describing the embodiments of the present disclosure, a thickness of a layer or region is zoomed out or in, i.e., these drawings are not provided in accordance with an actual scale. It should be appreciated that, in the case that such an element as layer, film, region or substrate is arranged "on" or "under" another element, it may be directly arranged "on" or "under" the other element, or an intermediate element may be arranged therebetween.
(3) In the case of no conflict, the embodiments of the present disclosure and the features therein may be combined to acquire new embodiments.

The above embodiments are merely for illustrative purposes, but shall not be construed as limiting the scope of the present disclosure. The scope of the present disclosure shall be subject to the scope defined by the appended claims.

What is claimed is:

1. A display substrate, comprising:
a gate driving circuitry arranged at a peripheral region of the display substrate;
n clock signal leads coupled to the gate driving circuitry, each clock signal lead extending in a first direction; and
n clock signal lines arranged sequentially in the first direction, each clock signal line extending in a second direction intersecting the first direction, where n is a positive integer greater than 1,
wherein the clock signal leads have a same length in the first direction, each clock signal lead extends from a first clock signal line to an $n^{th}$ clock signal line, and each clock signal lead is coupled to a corresponding clock signal line at a position where the clock signal lead intersects the clock signal line,
wherein the clock signal lines are arranged at a layer different from the clock signal leads, and each clock signal line is coupled to the corresponding clock signal lead through a via-hole,
wherein the display substrate further includes a base substrate, a gate metal layer arranged on the base substrate, a source/drain metal layer arranged on the base substrate, and an indium tin oxide (ITO) layer arranged on the base substrate, the gate metal layer comprises a pattern of the clock signal lines, the source/drain metal layer comprises a pattern of the clock signal leads, and the clock signal lines and the clock signal leads are coupled to the ITO layer through via-holes.

2. The display substrate according to claim 1, wherein the n clock signal lines are arranged sequentially from a side away from the gate driving circuitry to a side close to the gate driving circuitry in the first direction, the n clock signal leads are arranged sequentially from one end of each clock signal line to the other end of the clock signal line in the second direction, and an $m^{th}$ clock signal lead is coupled to an $m^{th}$ clock signal line, where m is a positive integer greater than or equal to 1 and smaller than or equal to n.

3. The display substrate according to claim 1, further comprising a base substrate, a gate metal layer arranged on the base substrate, a source/drain metal layer arranged on the base substrate, and an ITO layer arranged on the base substrate, wherein the gate metal layer comprises a pattern of the clock signal lines, the ITO layer comprises a pattern of the clock signal leads, and each clock signal line is coupled to the corresponding clock signal lead through a via-hole in an insulation layer between the ITO layer and the gate metal layer.

4. The display substrate according to claim 3, wherein the gate driving circuitry comprises a clock signal generation member, an end of each clock signal lead extending to the gate driving circuitry is coupled to the source/drain metal layer through a via-hole, and then coupled to the clock signal generation member through the source/drain metal layer.

5. The display substrate according to claim 1, wherein the ITO layer is a second ITO layer comprising a pixel electrode pattern.

6. The display substrate according to claim 1, wherein each clock signal lead comprises a lapping portion extending in the second direction at a position where each clock signal lead intersects the corresponding clock signal line, and the lapping portion is coupled to the corresponding clock signal line through the via-hole.

7. The display substrate according to claim 6, wherein orthogonal projections of the lapping portions of the clock signal leads onto the base substrate have a same area, and the clock signal leads have a same line width.

8. A display device, comprising a display substrate, wherein the display substrate comprises:
a gate driving circuitry arranged at a peripheral region of the display substrate;
n clock signal leads coupled to the gate driving circuitry, each clock signal lead extending in a first direction; and
n clock signal lines arranged sequentially in the first direction, each clock signal line extending in a second direction intersecting the first direction, where n is a positive integer greater than 1,
wherein the clock signal leads have a same length in the first direction, each clock signal lead extends from a first clock signal line to an $n^{th}$ clock signal line, and each clock signal lead is coupled to a corresponding clock signal line at a position where the clock signal lead intersects the clock signal line,
wherein the clock signal lines are arranged at a layer different from the clock signal leads, and each clock signal line is coupled to the corresponding clock signal lead through a via-hole,
wherein the display substrate further comprises a base substrate, a gate metal layer arranged on the base substrate, a source/drain metal layer arranged on the base substrate, and an indium tin oxide (ITO) layer arranged on the base substrate, wherein the gate metal layer comprises a pattern of the clock signal lines, the source/drain metal layer comprises a pattern of the clock signal leads, and the clock signal lines and the clock signal leads are coupled to the ITO layer through via-holes.

9. The display device according to claim 8, wherein the n clock signal lines are arranged sequentially from a side away from the gate driving circuitry to a side close to the gate driving circuitry in the first direction, the n clock signal leads are arranged sequentially from one end of each clock signal line to the other end of the clock signal line in the second direction, and an $m^{th}$ clock signal lead is coupled to an $m^{th}$ clock signal line, where m is a positive integer greater than or equal to 1 and smaller than or equal to n.

10. The display device according to claim 8, wherein the display substrate further comprises a base substrate, a gate metal layer arranged on the base substrate, a source/drain metal layer arranged on the base substrate, and an ITO layer arranged on the base substrate, wherein the gate metal layer comprises a pattern of the clock signal lines, the ITO layer comprises a pattern of the clock signal leads, and each clock signal line is coupled to the corresponding clock signal lead through a via-hole in an insulation layer between the ITO layer and the gate metal layer.

11. The display device according to claim 10, wherein the gate driving circuitry comprises a clock signal generation member, an end of each clock signal lead extending to the gate driving circuitry is coupled to the source/drain metal layer through a via-hole, and then coupled to the clock signal generation member through the source/drain metal layer.

12. The display device according to claim 8, wherein the ITO layer is a second ITO layer comprising a pixel electrode pattern.

13. The display device according to claim 8, wherein each clock signal lead comprises a lapping portion extending in the second direction at a position where each clock signal lead intersects the corresponding clock signal line, and the lapping portion is coupled to the corresponding clock signal line through the via-hole.

14. The display device according to claim 13, wherein orthogonal projections of the lapping portions of the clock signal leads onto the base substrate have a same area, and the clock signal leads have a same line width.

15. A display substrate, comprising:
a gate driving circuitry arranged at a peripheral region of the display substrate;
n clock signal leads coupled to the gate driving circuitry, each clock signal lead extending in a first direction; and
n clock signal lines arranged sequentially in the first direction, each clock signal line extending in a second direction intersecting the first direction, where n is a positive integer greater than 1,
wherein the clock signal leads have a same length in the first direction, each clock signal lead extends from a first clock signal line to an $n^{th}$ clock signal line, and each clock signal lead is coupled to a corresponding clock signal line at a position where the clock signal lead intersects the clock signal line,
wherein the clock signal lines are arranged at a layer different from the clock signal leads, and each clock signal line is coupled to the corresponding clock signal lead through a via-hole,
the display substrate further includes a base substrate, a gate metal layer arranged on the base substrate, a source/drain metal layer arranged on the base substrate, and an ITO layer arranged on the base substrate, wherein the gate metal layer comprises a pattern of the clock signal lines, the ITO layer comprises a pattern of the clock signal leads, and each clock signal line is coupled to the corresponding clock signal lead through a via-hole in an insulation layer between the ITO layer and the gate metal layer.

* * * * *